(12) United States Patent
Dijken et al.

(10) Patent No.: US 10,433,418 B2
(45) Date of Patent: Oct. 1, 2019

(54) ASSEMBLY AND LIGHTING DEVICE COMPRISING THE ASSEMBLY

(71) Applicant: SIGNIFY HOLDING B.V., Eindhoven (NL)

(72) Inventors: Durandus Kornelius Dijken, Eindhoven (NL); Hendrik Jan Eggink, Eindhoven (NL)

(73) Assignee: SIGNIFY HOLDING B.V., Endhoven (NL)

( * ) Notice: Subject to any disclaimer, the term of this patent is extended or adjusted under 35 U.S.C. 154(b) by 0 days.

(21) Appl. No.: 15/781,140

(22) PCT Filed: Nov. 28, 2016

(86) PCT No.: PCT/EP2016/079037
§ 371 (c)(1),
(2) Date: Jun. 3, 2018

(87) PCT Pub. No.: WO2017/097627
PCT Pub. Date: Jun. 15, 2017

(65) Prior Publication Data
US 2018/0352650 A1     Dec. 6, 2018

(30) Foreign Application Priority Data

Dec. 8, 2015 (EP) .................................. 15198322

(51) Int. Cl.
*H05K 1/02* (2006.01)
*H05K 3/44* (2006.01)
(Continued)

(52) U.S. Cl.
CPC ........... *H05K 1/0272* (2013.01); *F21V 29/83* (2015.01); *H05K 1/021* (2013.01); *H05K 1/0204* (2013.01);
(Continued)

(58) Field of Classification Search
CPC .. H05K 1/0203; H05K 1/0204; H05K 1/0209; H05K 1/021; H05K 1/0272;
(Continued)

(56) References Cited

U.S. PATENT DOCUMENTS 9,022,603 B1 * 5/2015 Moghal ................. F21V 17/101
362/217.02
2005/0047169 A1 * 3/2005 Brandenburg ........ F21S 41/663
362/545
(Continued)

FOREIGN PATENT DOCUMENTS

| CN | 201829499 U | 5/2011 |
| CN | 203686951 U | 7/2014 |

(Continued)

*Primary Examiner* — William H. Mayo, III
*Assistant Examiner* — Rhadames Alonzo Miller
(74) *Attorney, Agent, or Firm* — Daniel J. Piotrwoski

(57) ABSTRACT

An assembly (1) is disclosed, comprising at least one electrical device (5) and at least one carrier substrate (2) arranged to support the at least one electrical device (5). The at least one carrier substrate (2) is arranged with at least one tubular structure (6), which is at least in part hollow and arranged so as to permit passage of fluid through the at least one carrier substrate (2), for example between a first side (3) of the carrier substrate (2) and a second side (4) of the carrier substrate (2), and wherein the at least one tubular structure (6) is arranged such that it has an extension so that it protrudes a predefined distance from at least one of the first side (3) and the second side (4). A lighting device comprising the assembly (1) and a method (30) for manufacturing the assembly (1) are also disclosed.

11 Claims, 6 Drawing Sheets

(51) Int. Cl.
  *F21V 29/83* (2015.01)
  *F21Y 115/10* (2016.01)

(52) U.S. Cl.
  CPC .......... *H05K 3/445* (2013.01); *F21Y 2115/10* (2016.08); *H05K 1/0203* (2013.01); *H05K 1/0209* (2013.01); *H05K 2201/064* (2013.01); *H05K 2201/09063* (2013.01); *H05K 2201/10106* (2013.01); *H05K 2201/10257* (2013.01)

(58) Field of Classification Search
  CPC .......... H05K 2201/09063; H05K 2201/10106; H05K 2201/10257; H05K 3/445
  See application file for complete search history.

(56) References Cited

U.S. PATENT DOCUMENTS

| | | | | |
|---|---|---|---|---|
| 2006/0181878 | A1* | 8/2006 | Burkholder | F21V 29/004 362/294 |
| 2008/0070012 | A1* | 3/2008 | Kuo | H05K 1/0206 428/209 |
| 2009/0116252 | A1 | 5/2009 | Kille et al. | |
| 2009/0152568 | A1* | 6/2009 | Lu | H01L 33/642 257/88 |
| 2011/0013395 | A1* | 1/2011 | Melzner | F21S 2/005 362/240 |
| 2011/0045577 | A1* | 2/2011 | Bruzewicz | B01L 3/502707 435/287.1 |
| 2011/0157891 | A1* | 6/2011 | Davis | B29C 45/14467 362/244 |
| 2011/0157892 | A1* | 6/2011 | Chen | F21K 9/00 362/247 |
| 2011/0316417 | A1* | 12/2011 | Chen | F21V 29/006 315/32 |
| 2012/0069543 | A1* | 3/2012 | Chen | F21K 9/00 362/84 |
| 2012/0223344 | A1* | 9/2012 | Dohn | F21K 9/00 257/88 |
| 2012/0293998 | A1* | 11/2012 | Mignot | F21V 5/007 362/235 |
| 2012/0320595 | A1* | 12/2012 | Enke | H05B 33/0803 362/249.06 |
| 2013/0010479 | A1* | 1/2013 | Chen | F21V 29/006 362/373 |
| 2013/0094236 | A1* | 4/2013 | Kloos | F21V 7/00 362/516 |
| 2014/0217889 | A1* | 8/2014 | Chen | F21S 9/022 315/86 |
| 2014/0252403 | A1* | 9/2014 | Feichtinger | H01C 7/12 257/99 |
| 2014/0292192 | A1 | 10/2014 | Rodinger et al. | |
| 2014/0321054 | A1* | 10/2014 | Kaefer | H05K 7/20972 361/692 |
| 2014/0355211 | A1 | 12/2014 | Patil et al. | |
| 2016/0215953 | A1* | 7/2016 | Chai | F21V 17/164 |

FOREIGN PATENT DOCUMENTS

| | | | | |
|---|---|---|---|---|
| DE | 202010014381 U1 | 12/2010 | | |
| GB | 2515409 A | * 12/2014 | ........ | H05K 1/0204 |
| GB | 2515409 A | 12/2014 | | |
| JP | H07183625 A | 7/1995 | | |
| JP | H0851267 A | 2/1996 | | |
| JP | S63167773 A | 7/1998 | | |
| JP | 2005085835 A | 3/2005 | | |
| JP | 2010010298 A | 1/2010 | | |
| JP | 2014007206 A | 1/2014 | | |
| KR | 101319564 B1 | 10/2013 | | |

* cited by examiner

ASSEMBLY AND LIGHTING DEVICE COMPRISING THE ASSEMBLY

CROSS-REFERENCE TO PRIOR APPLICATIONS

This application is the U.S. National Phase application under 35 U.S.C. § 371 of International Application No. PCT/EP2016/079037, filed on Nov. 28, 2016, which claims the benefit of European Patent Application No. 15198322.8, filed on Nov. 8, 2015. These applications are hereby incorporated by reference herein. TECHNICAL FIELD The present invention relates to an assembly comprising at least one electrical device and at least one carrier substrate arranged to support the at least one electrical device.

BACKGROUND

Operation of electrical devices, such as high-power semiconductor devices, high-power lasers, microprocessors and/or light emitting diodes (LEDs), is often associated with generation of heat. The heat is a byproduct that may have an injurious effect on performance and lifetime of the electrical device. Effective cooling is therefore useful and desired in many applications. As an example, a luminaire or lighting device which is capable of providing a high luminous flux may require efficient cooling of the light sources included in the luminaire or lighting device, if the heat generated by the light sources is to have no or only little detrimental effect on the lifetime of the luminaire or lighting device. High-bay luminaires (that is, luminaires which are utilized in high-ceiling environments such as industrial and warehousing applications) based on LED light sources may generate light having a luminous flux up to about 25 klm or more. The ambient temperature in environments where high-bay luminaires are employed may be up to 50° C. or more, whereas the maximum allowable LED solder temperature is usually between about 80° C. and 100° C., such as, for example, 85° C. or 95° C. In order to cool high-bay luminaires, heat exchange component(s) made of Al may for example be employed. However, such Al heat exchange component(s) are relatively expensive, due to their relatively high weight (Al has a relatively high cost per kg) and because the Al heat exchange component(s) typically are made by dye-casting, which is a relatively expensive process. US 2014/0292192 A1 discloses an LED bulb comprising a structural shell formed by folding a flat printed circuit board (PCB) into a three-dimensional polyhedron shape and a fitting for removably coupling the bulb to a light socket. The PCB comprises a plurality of LEDs, at least one LED mounted electronically on a plurality of faces of the polyhedron, and a driver circuit for driving each LED. The perimeter of the PCB is shaped to join adjacent faces. Each LED produces minimal excess heat, which is partially conducted by a metallic heat sink bridge to the PCB and dissipated to the air through the PCB and through a plurality of spaces in the shell. US 2014/0292192 A1 discloses ventilation holes drilled in the PCB to promote air circulation from inside to outside of the folded LED bulb. According to US 2014/0292192 A1, the holes help to dissipate heat generated by LEDs, and may further increase the lifetime of the LED bulb. However, there is still a need in the art for increased efficiency and/or capacity in dissipation of heat generated in or by electrical devices.

SUMMARY

In view of the above discussion, a concern of the present invention is to provide an assembly that comprises at least one electrical device and which assembly facilitates or allows for achieving a relatively high efficiency in dissipation of heat generated by the at least one electrical device when operated.

A further concern of the present invention is to provide an assembly that comprises at least one electrical device, which assembly facilitates or allows for achieving a relatively high efficiency in dissipation of heat generated by the at least one electrical device when operated, and which assembly further has a relatively low weight.

A further concern of the present invention is to provide an assembly that comprises at least one electrical device, which assembly facilitates or allows for achieving a relatively high efficiency in dissipation of heat generated by the at least one electrical device when operated, and which assembly further is relatively inexpensive to manufacture.

To address at least one of these concerns and other concerns, an assembly, a lighting device or luminaire, and a method for manufacturing an assembly in accordance with the independent claims are provided. Preferred embodiments are defined by the dependent claims.

According to a first aspect of the present invention, there is provided an assembly comprising at least one electrical device and at least one carrier substrate arranged to support the at least one electrical device. The at least one carrier substrate comprises a metal core printed circuit board and it may for example be arranged to support the at least one electrical device on at least one side of the at least one carrier substrate. The at least one carrier substrate is arranged with at least one tubular structure. The at least one tubular structure is at least in part hollow, and is arranged so as to permit passage of fluid through the at least one carrier substrate between a first side of the at least one carrier substrate and a second side of the at least one carrier substrate. The at least one tubular structure is arranged such that it has an extension so that it protrudes a predefined distance from at least one of the first side and the second side. The at least one carrier substrate may for example be arranged to support the at least one electrical device on at least one side of the first side and the second side of the at least one carrier substrate. The at least one tubular structure is constituted by an integrally arranged portion of the at least one carrier substrate and comprises or is constituted by a deep-drawn, stamped-out or punched-through portion of the at least one carrier substrate.

The at least one carrier substrate is preferably at least in part thermally conductive, wherein (at least) heat generated by the at least one electrical device when in use can be transferred away from the at least one electrical device by way of the heat being transferred to fluid passing or flowing through the at least one tubular structure. The fluid may for example comprise (ambient) air. Thus, by way of the at least one carrier substrate being arranged with at least one tubular structure, which is at least in part hollow (i.e. having at least one space, void or cavity inside it) and is arranged so as to permit passage of fluid through the at least one carrier substrate between a first side of the carrier substrate and a second side of the carrier substrate, heat generated by the at least one electrical device when in use or when operated may be dissipated by way of convection taking place within the at least one tubular structure where a flow of fluid (e.g., air) may pass through the at least one tubular structure, between a first side of the carrier substrate and a second side of the carrier substrate. Thus, heat generated by the at least one electrical device when in use or when operated may be transferred by way of at least one carrier substrate to the at least one tubular structure, where it may be transferred to fluid passing through the at least one tubular structure and between the first side of the carrier substrate and the second side of the carrier substrate, and in turn be transferred away from the assembly. By way of the at least one carrier substrate being arranged such that it has an extension so that it protrudes a predefined distance from at least one of the first side and the second side, a relatively large surface area for transferring heat generated by the at least one electrical device when in use or when operated to fluid passing through the at least one tubular structure may be provided. Thus, the assembly may be capable of achieving a relatively high efficiency in dissipation of heat generated by the at least one electrical device when operated. In order to further increase the surface area for transferring heat generated by the at least one electrical device when in use or when operated, the at least one tubular structure may for example include an internal or inner fin structure (e.g., including one or several fins) or the like.

By way of the at least one carrier substrate being arranged with at least one tubular structure, which is at least in part hollow and is arranged so as to permit passage of fluid through the at least one carrier substrate between a first side of the carrier substrate and a second side of the carrier substrate, one or more passages through the at least one carrier substrate may be provided. Thereby, the at least one carrier substrate exhibits a perforated structure. By way of the perforated structure of the at least one carrier substrate, the weight of the at least one carrier substrate may become relatively low, as compared to if the at least one carrier substrate would be completely solid. And since less material may be needed for the at least one carrier substrate (by way of the perforated structure of the at least one carrier substrate) as compared to if the at least one carrier substrate would be completely solid, the cost of the at least one carrier substrate, and thereby possibly the cost of the entire assembly, may become relatively low.

The at least one tubular structure may be arranged such that it has an extension so that it protrudes a predefined distance both from the first side and from the second side. The at least one tubular structure may protrude the same or substantially the same distance from both from the first side and from the second side.

The first side may for example be opposite to the second side.

The at least one tubular structure may be arranged such that it has an extension so that it protrudes a predefined distance from one of the first side and the second side, wherein the at least one electrical device may be supported on the other one of the first side and the second side.

The at least one tubular structure is constituted by an integrally arranged portion of the at least one carrier substrate. That is to say, the at least one tubular structure is comprised in the at least one carrier substrate and is an integral portion of the at least one carrier substrate. The at least one tubular structure comprises or is constituted by a deep-drawn, stamped-out or punched-through portion of the at least one carrier substrate. That is to say, the at least one carrier substrate is arranged with at least one tubular structure by way of deep-drawing, stamping out, or punching through at least a portion of the at least one carrier substrate. The at least one carrier substrate comprises a metal core printed circuit board (MCPCB), and the at least one tubular structure may be made by stamping a portion of the at least one carrier substrate, for example so that the portion attains a U-like shape (as seen from one side), or a cylindrical shape, similarly to stamping of a beverage can, and then removing the bottom of the shape, for example by stamping or laser cutting.

In an alternative assembly, the at least one tubular structure is not an integrally arranged portion of the at least one carrier substrate or is not comprised in the at least one carrier substrate.

The at least one carrier substrate may comprise at least one through-hole. The at least one through-hole may extend between the first side and the second side. At least a portion of the at least one tubular structure may be arranged within the at least one through-hole. That is to say, the at least one tubular structure may be a separate component or element of the assembly, not comprised in the at least one carrier substrate. The at least one tubular structure may be thermally coupled to the at least one carrier substrate, e.g., at or to an inner wall of the at least one through-hole, for example by way of or via thermal interface material (TIM) such as thermal grease. The at least one tubular structure may be thermally coupled to the at least one carrier substrate in principle by means of any appropriate way of providing or creating a thermal coupling. For example, the at least one tubular structure may be thermally coupled to the at least one carrier substrate, e.g., at or to an inner wall of the at least one through-hole, by means of a screwing and/or brazing. The at least one tubular structure may be at least in part thermally conductive. The at least one carrier substrate may be provided with at least one through-hole for example by means of drilling, stamping, punching through, and/or laser cutting at least a portion of the at least one carrier substrate.

At least a portion of the at least one tubular structure may for example be clamped or fitted within the at least one through-hole. In the context of the present application, at least a portion of the at least one tubular structure being fitted within the through-hole should be understood as that the at least one tubular structure may be shaped so as to precisely fit within the through-hole, i.e. so that the tubular structure has a shape that conforms to the shape of the through-hole. For example, the at least one through-hole may be cylindrical or substantially cylindrical, and the tubular structure may be cylindrical or substantially cylindrical, and sized so as to precisely fit within the through-hole. It is however to be understood that other geometries than a cylindrical one are possible.

In alternative or in addition, at least a portion of an outer wall of the least one tubular structure may be connected or coupled to an inner wall of the at least one through-hole, for example by way of glue and/or TIM.

The at least one carrier substrate may be arranged with more than one tubular structure.

At least one tubular structure may be constituted by integrally arranged portion of the at least one carrier substrate, and at least one tubular structure may be a separate component or element of the assembly, not comprised in the at least one carrier substrate, such as described in the foregoing.

The at least one carrier substrate may be arranged with an arrangement of a plurality of tubular structures, each tubular structure being at least in part hollow and arranged so as to permit passage of fluid through the at least one carrier substrate between the first side and the second side, and each tubular structure being arranged such that it has an extension so that it protrudes a predefined distance from at least one of the first side and the second side.

The at least one carrier substrate may for example be arranged such that the plurality of tubular structures are regularly distributed on the first side of the at least one carrier substrate and/or the second side of the at least one carrier substrate. The at least one carrier substrate may for example be arranged such that the arrangement of the plurality of tubular structures form a predefined pattern on the first side of the at least one carrier substrate and/or the second side of the at least one carrier substrate. In the context of the present application, by the plurality of tubular structures being regularly distributed on the first side of the at least one carrier substrate and/or the second side of the at least one carrier substrate regularly distributed, it is meant that tubular structures are periodically occurring along at least one direction along the first side of the at least one carrier substrate and/or the second side of the at least one carrier substrate. The plurality of tubular structures could for example be arranged at the nodes of an imaginary grid pattern on the first side of the at least one carrier substrate and/or the second side of the at least one carrier substrate.

In alternative, the at least one carrier substrate may be arranged such that the plurality of tubular structures are irregularly distributed on the first side and/or the second side. For example, when seen from the above, the arrangement of the plurality of tubular structures on the first side of the at least one carrier substrate and/or the second side of the at least one carrier substrate may for example form a pattern similar to a Penrose pattern, or another pattern having n-fold (n being an integer) rotational symmetry in combination with quasi-periodic translational order. It is to be understood that other patterns are possible. With an irregular distribution of the plurality of tubular structures on the first side and/or the second side, there may be no or only few folding or bending lines in the at least one carrier substrate, which may facilitate or allow for achieving a relatively high rigidity and/or mechanical stability of the at least one carrier substrate.

In addition or in alternative the at least one carrier substrate may be provided with at least one indentation. The at least one indentation may for example be provided by way of punching it into the at least one carrier substrate by means of an appropriate punching tool. One or several indentations may be formed for example on the first side and/or the second side. Providing the at least one carrier substrate with at least one indentation may facilitate or allow for achieving a relatively high rigidity and/or mechanical stability of the at least one carrier substrate.

The at least one carrier substrate may be arranged such that some of the plurality of tubular structures are irregularly distributed on the first side and/or the second side, and some of the plurality of tubular structures are regularly distributed on the first side and/or the second side.

The assembly may comprise a plurality of electrical devices.

The assembly may be arranged such that it is constituted by a plurality of substantially identical sub-assemblies, each sub-assembly comprising a portion or part of the carrier substrate and at least one of the plurality of electrical devices and being arranged with at least one of the plurality of tubular structures. In the context of the present application, by substantially identical sub-assemblies it is meant that the arrangement of the electrical device(s) and the tubular structure(s) relatively to the respective portion of the sub-assembly's carrier substrate is the same or substantially the same for all sub-assemblies, such that the carrier substrates of the respective sub-assemblies can be regarded as 'unit cells', which when interconnected (e.g., at edges thereof) form an extended carrier substrate with regularly arranged electrical devices and tubular structures on the extended carrier substrate. It will be appreciated that in order for the carrier substrates of the respective sub-assemblies to be regarded as 'unit cells' it is not necessary that the arrangement of the electrical device(s) and the tubular structure(s) relatively to the respective portion of the sub-assembly's carrier substrate is exactly the same for all sub-assemblies.

The at least one electrical device may for example comprise at least one light-emitting element. The at least one light-emitting element may for example include or be constituted by a solid state light emitter. Examples of solid state light emitters include inorganic LEDs, organic LEDs, laser diodes and light conversion elements such as phosphor plates, Lumiramic plates or phosphor conversion crystals. The at least one light-emitting element may comprise at least one Chip on Board (COB) LED light source. Solid state light emitters are relatively cost efficient light sources, since they in general are relatively inexpensive to manufacture, have a relatively high optical efficiency, have a relatively long lifetime and are environmentally friendly. However, in the context of the present application, the term "light-emitting element" should be understood to mean substantially any device or element that is capable of emitting radiation in any region or combination of regions of the electromagnetic spectrum, for example the visible region, the infrared region, and/or the ultraviolet region, when activated e.g. by applying a potential difference across it, passing a current through it or illuminating it with light of particular wavelengths. Therefore a light-emitting element can have monochromatic, quasi-monochromatic, polychromatic or broadband spectral emission characteristics. Examples of light-emitting elements include semiconductor, organic, or polymer/polymeric LEDs, violet LEDs, blue LEDs, red LEDs, green LEDs, amber LEDs, UV-A LEDs, UV-B LEDs, UV-C LEDs, optically pumped phosphor coated LEDs, optically pumped nano-crystal LEDs, lasers, laser pumped phosphor, laser pumped nano-crystals, optically pumped light conversion elements or any other similar devices as would be readily understood by a person skilled in the art. Furthermore, the term light-emitting element can, according to one or more embodiments of the present invention, mean a combination of the specific light-emitting element or light-emitting elements which emit the radiation in combination with a housing or package within which the specific light-emitting element or light-emitting elements are positioned or arranged. For example, the term light-emitting element can encompass a bare LED die arranged in a housing, which may be referred to as a LED package.

The assembly may comprise at least one optical element arranged to receive light emitted by the at least one light-emitting element and output optically modified light. The at least one optical element may for example comprise at least one lens, at least one glass or polymer plate, at least one total internal reflection (TIR) lens, at least one reflector, at least one diffuser, and/or some other type of optical element for achieving or obtaining a desired or required optical effect or beam shaping capability of the assembly. In view of the above, in the context of the present application, by "optically modified" light it is meant for example focused, reflected, refracted and/or diffused light, etc., or light that has been shaped in some other manner. Any one or each light-emitting element may be covered with a 'blob' of silicone or an individual glass- or polymer-plate, whereby the light-emitting element may be sealed watertight. In alternative or in addition, any one or each light-emitting element may be covered with TIR lens optics. Such TIR lens optics may facilitate or allow for obtaining different beam shapes (relatively wide beams, relatively narrow beams, and intermediate beam widths). In alternative or in addition, any one or each light-emitting element may be provided with a reflector (e.g., a reflector cup) mounted thereon. A diffuser may be arranged within the reflector (cup).

The at least one carrier substrate may for example comprise a printed circuit board (PCB). The PCB may for example comprise a metal core PCB (MCPCB).

For example, especially in case the at least one carrier substrate comprises a MCPCB, and where the at least one carrier substrate comprises at least one through-hole that extends between the first side and the second side and with at least a portion of the at least one tubular structure being arranged within the at least one through-hole, the at least one tubular structure (which for example may comprise a metal tube, such as an Al tube) may be press-fitted (i.e. with force) into the at least one through-hole. By press-fitting the at least one tubular structure into the at least one through-hole, thermal coupling between the at least one tubular structure and the at least one carrier substrate may be achieved with no or only little need for TIM such as thermally conductive paste or the like.

In alternative or in addition, the at least one carrier substrate may for example comprise a metal plate or plate-like structure provided with at least one through-hole that may extend between the first side and the second side. The metal plate or plate-like structure may for example be made of Al. Onto the metal plate or plate-like structure electrically insulating tracks or layer(s) may be printed, for example by means of screen printing. Electrically conductive tracks may be printed on the electrical resistant tracks or layer(s), for example by means of screen printing. The at least one electrical device may be powered by way of the electrically conductive tracks. The at least one tubular structure (which for example may comprise a metal tube, such as an Al tube) may for example be press-fitted (i.e. with force) into the at least one through-hole provided in the metal plate or plate-like structure.

In alternative or in addition, the at least one carrier substrate may for example comprise a flexible foil ("flex foil"), such as, for example, a flex foil made of Kapton, mounted or coupled to (a side of) a metal plate or plate-like structure for example by way of gluing or using adhesive tape. The flex foil may have electrically conductive tracks thereon e.g. for powering the at least one electrical device. The metal plate or plate-like structure and the flex foil may be provided with at least one through-hole that may extend between the first side and the second side. The first side may be on the flex foil and the second side may be on the metal plate or plate-like structure, or vice versa. The at least one electrical device may for example be reflow soldered onto the flex foil.

According to a second aspect there is provided a luminaire or lighting device comprising an assembly according to the first aspect, wherein the at least one electrical device comprises at least one light-emitting element. The luminaire or lighting device may comprise wiring and electronics arranged to connect and power the at least one light-emitting element and possibly other electrical component(s) included in the luminaire or lighting device.

According to a third aspect there is provided a method for manufacturing an assembly comprising at least one electrical device and at least one carrier substrate arranged to support the at least one electrical device, wherein the at least one carrier substrate comprises a metal core printed circuit board. The method comprises arranging the at least one carrier substrate with at least one tubular structure which is at least in part hollow and arranged so as to permit passage of fluid through the at least one carrier substrate between a first side of the at least one carrier substrate and a second side of the at least one carrier substrate, wherein the at least one tubular structure is arranged such that it has an extension so that it protrudes a predefined distance from at least one of the first side and the second side.

The method may comprise coupling or arranging the at least one electrical device to/on the at least one carrier substrate. Coupling or arranging the at least one electrical device to/on the at least one carrier substrate may be carried out after the arranging of the at least one carrier substrate with the at least one tubular structure.

The arranging of the at least one carrier substrate with the at least one tubular structure comprises deep-drawing, stamping out, and/or punching through at least a portion of the at least one carrier substrate, whereby the at least one tubular structure is constituted by an integrally arranged portion of the at least one carrier substrate.

Alternatively, the arranging of the at least one carrier substrate with the at least one tubular structure may comprise providing the at least one carrier substrate with at least one through-hole extending between the first side and the second side, possibly providing at least one tubular structure, and arranging at least a portion of the at least one tubular structure within the at least one through-hole such that the at least one tubular structure protrudes the predefined distance from the at least one of the first side and the second side.

Further objects and advantages of the present invention are described in the following by means of exemplifying embodiments. It is noted that the present invention relates to all possible combinations of features recited in the claims. Further features of, and advantages with, the present invention will become apparent when studying the appended claims and the description herein. Those skilled in the art realize that different features of the present invention can be combined to create embodiments other than those described herein.

BRIEF DESCRIPTION OF THE DRAWINGS

Exemplifying embodiments of the invention will be described below with reference to the accompanying drawings.

Figure 1:
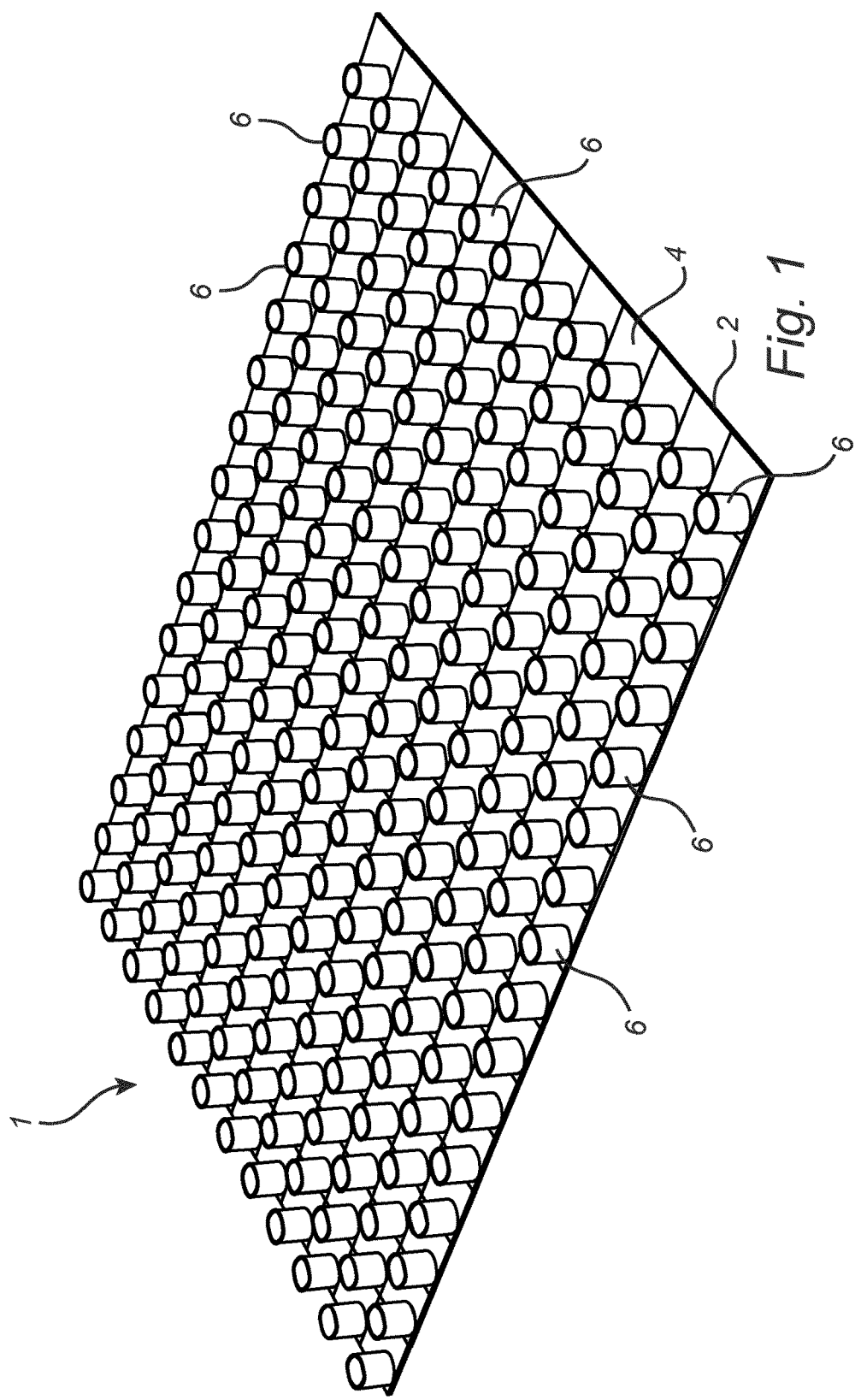
FIG. 1 is a schematic view of an assembly according to an embodiment of the present invention.

All the figures are schematic, not necessarily to scale, and generally only show parts which are necessary in order to elucidate embodiments of the present invention, wherein other parts may be omitted or merely suggested.

DETAILED DESCRIPTION

The present invention will now be described hereinafter with reference to the accompanying drawings, in which exemplifying embodiments of the present invention are shown. The present invention may, however, be embodied in many different forms and should not be construed as limited to the embodiments of the present invention set forth herein; rather, these embodiments of the present invention are provided by way of example so that this disclosure will convey the scope of the invention to those skilled in the art. In the drawings, identical reference numerals denote the same or similar components having a same or similar function, unless specifically stated otherwise.

Figure 2:
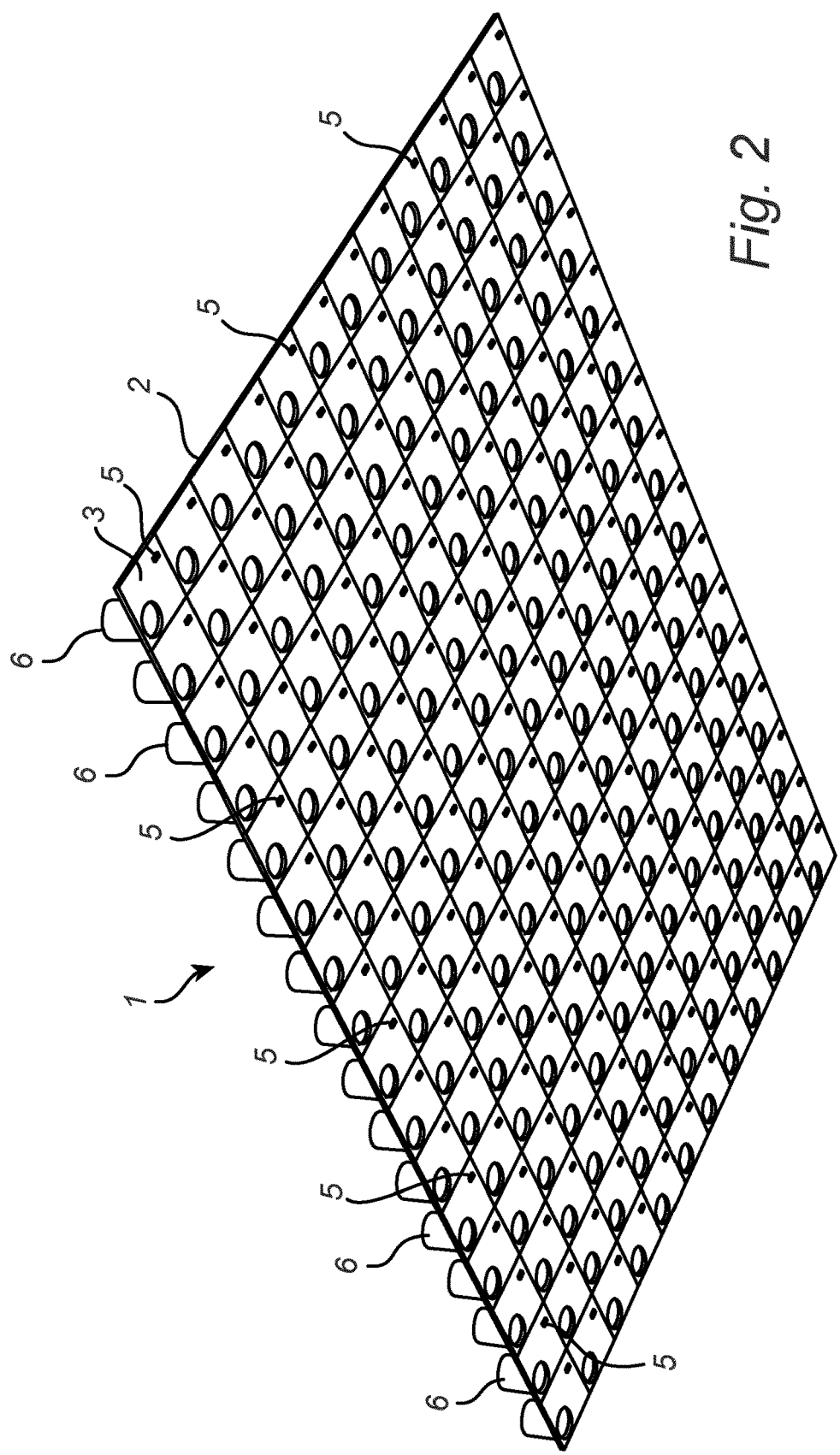
FIG. 2 is a schematic view of the assembly illustrated in FIG. 1, as viewed from another direction.

FIGS. 1 and 2 are schematic views of an assembly 1 according to an embodiment of the present invention. FIG. 2 is a schematic view of the assembly 1 illustrated in FIG. 1, as viewed from another direction as compared to FIG. 1. It is to be understood that FIGS. 1 and 2 generally only show parts which are necessary in order to elucidate embodiments of the present invention, wherein other parts may be omitted or merely suggested. The assembly 1 comprises a carrier substrate 2 arranged to support at least one electrical device. The carrier substrate 2 may for example comprise or be constituted by one or more PCBs, such as, for example, one or more MCPCBs (e.g., having aluminum or copper core). In case the carrier substrate 2 would include several (MC) PCBs, they may for example be interconnected or coupled at edges thereof, for example using any appropriate interconnection or coupling technique as known in the art, so as to form the carrier substrate 2. The carrier substrate 2 has a first side 3 and a second side 4. In accordance with the embodiment of the present invention illustrated in FIGS. 1 and 2, the first side 3 and the second side 4 are oppositely arranged with respect to each other. That is to say, the first side 3 is opposite to the second side 4, or vice versa.

In accordance with the embodiment of the present invention illustrated in FIGS. 1 and 2, the assembly 1 comprises a plurality of electrical devices 5 which are visible in FIG. 2 (only some of the electrical devices are indicated by reference numerals 5 in FIG. 2). As illustrated in FIG. 2, the electrical devices 5 may be arranged on the carrier substrate 2 so as to be evenly or regularly distributed on the carrier substrate 2, for example on the first side 3 such as illustrated in FIG. 2. In alternative or in addition, electrical devices 5 may be arranged on another side of the carrier substrate 2, such as for example the second side 4. The electrical devices 5 may be coupled or connected to the carrier substrate 2 for example by way of reflow soldering, or by some other appropriate means or technique for example as known in the art. Further in accordance with the embodiment of the present invention illustrated in FIGS. 1 and 2, each of the electrical devices 5 comprises a light-emitting element. The light-emitting element may for example include or be constituted by a solid state light emitter, such as, for example, a LED or a LED-based light source such as a COB LED light source. By employing COB LED light sources relatively low bill of material component costs and costs of assembling the components may be achieved. A single COB LED light source is generally capable of emitting light having a luminous flux that is higher than that of a single LED. It is to be understood that the number of electrical devices 5 comprised in the assembly 1 as illustrated in FIG. 2 is according to an exemplifying embodiment of the present invention, and that the number of electrical devices 5 comprised in the assembly 1 may be smaller or larger than the number of electrical devices 5 comprised in the assembly 1 as illustrated in FIG. 2. It is further to be understood that it is not necessary for (each of) the electrical devices 5 to comprise light-emitting elements. One or several or even all of the electrical devices 5 may in accordance with embodiments of the present invention comprise electrical devices other than light-emitting elements.

As illustrated in FIGS. 1 and 2, the carrier substrate 2 is arranged with an arrangement of a plurality of tubular structures 6. Each of the tubular structures 6 is at least in part hollow and arranged so as to permit passage of fluid through the carrier substrate 2 between the first side 3 and the second side 4. Each of the tubular structures 6 may for example be arranged so as to permit passage of air through the carrier substrate 2 between the first side 3 and the second side 4. It is to be understood that the number of tubular structures 6 comprised in the assembly 1 as illustrated in FIGS. 1 and 2 is according to an exemplifying embodiment of the present invention, and that the number of tubular structures 6 comprised in the assembly 1 may be smaller or larger than the number of tubular structures 6 comprised in the assembly 1 as illustrated in FIGS. 1 and 2. In accordance with the embodiment of the present invention illustrated in FIGS. 1 and 2, the number of tubular structures 6 comprised in the assembly 1 is equal to the number of electrical devices 5 (light-emitting elements) comprised in the assembly 1, as indicated in FIG. 2. However, it is to be understood that is according to an exemplifying embodiment of the present invention, and that the number of tubular structures 6 comprised in the assembly 1 may be large than the number of electrical devices 5 (e.g., light-emitting elements) comprised in the assembly 1, or vice versa.

Each tubular structure 6 is arranged such that it has an extension so that it protrudes a predefined distance from the first side 3. In alternative or in addition, each (or any) tubular structure 6 may be arranged such that it has an extension so that it protrudes a predefined distance from the second side 4 (not shown in the figures).

It is to be understood that in the figures the tubular structures are not necessarily drawn to scale. In particular, the distance by which the tubular structures protrude from the first side 3 as illustrated in the drawings is not necessarily drawn to scale.

In accordance with the embodiment of the present invention illustrated in FIGS. 1 and 2, each of the tubular structures 6 is constituted by an integrally arranged portion of the carrier substrate 2. That is to say, each of the tubular structures 6 is comprised in carrier substrate 2, and is an integral portion of the carrier substrate 2. For realizing or implementing such an arrangement, each or any one of the tubular structures 6 may for example comprise or be constituted by a deep-drawn, stamped-out or punched-through portion of the carrier substrate 2. That is to say, the carrier substrate 2 may be arranged with the tubular structures 6 for example by way of deep-drawing, stamping out, or punching through at least a portion of the carrier substrate 2. Deep-drawing, stamping out, or punching through at least a portion of the carrier substrate 2 may for example be carried out using any technique and/or equipment for such processes as known in the art.

In accordance with the embodiment of the present invention illustrated in FIGS. 1 and 2, each tubular structure 6 may be comprised by a tube, the inner walls of which define a cylindrical passage for fluid such as, for example, air, and having a first end opening at the first side 3 of the carrier substrate 2 and a second end opening at the second side 4 of the carrier substrate 2. The passage may hence have a circular cross-sectional area perpendicular to a longitudinal direction of the passage and/or the tubular structure 6. The diameter of the passage may be in the range of about 2 mm to 12 mm, and the cross-sectional area may hence for example be in the range of about 3 mm$^2$ to 113 mm$^2$.

The circular cross-sectional area of the passage is according to an exemplifying embodiment of the present invention. It is to be understood that other shapes of the passage, and in particular other shapes of the passage's cross section perpendicular to a longitudinal direction of the passage and/or the tubular structure 6, are possible. Thus, each or any one of the tubular structure 6 may include a passage for fluid having a cross-sectional area perpendicular to a longitudinal direction of the passage and/or the tubular structure 6 that is not circular and that exhibits another shape, such as, for example, polygonal, triangular, square, rhombic, oval, etc. Irrespective of the particular shape of the cross-sectional area, the cross-sectional area may for example be in the range of about 3 mm$^2$ to 113 mm$^2$.

The cross-sectional area perpendicular to a longitudinal direction of the passage and/or the tubular structure 6 for the passage for fluid of each or any one of the tubular structure 6 may vary, e.g., along the longitudinal direction of the passage and/or the tubular structure 6. For example, the passage may have tapered inner walls, where the tapering may be towards one of the ends of the passage.

Each or any of the tubular structures 6 may be arranged such that it has an extension so that it protrudes a distance from the first side 3 (and/or from the second side 4) in the range of about 1 mm to 30 mm, for example (about) 3 mm. It is not necessary that all of the tubular structures 6 are protruding from the first side 3 (and/or from the second side 4) by the same distance, but the distances with which the tubular structures 6 are protruding from the first side 3 (and/or from the second side 4) may differ.

As indicated in FIGS. 1 and 2, the assembly 1 may be arranged such that it is constituted by a plurality of (substantially) identical sub-assemblies, or portions of the assembly 1, wherein each sub-assembly comprises a part or portion of the carrier substrate 2 and at least one of the electrical devices 5, and is arranged with at least one of the tubular structures 6. In accordance with the embodiment of the present invention illustrated in FIGS. 1 and 2, each sub-assembly comprises by way of example one of the electrical devices 5, and the sub-assembly's portion of the carrier substrate 2 is arranged with one of the tubular structures 6. This is further illustrated in FIGS. 3 and 4, which are schematic views of a part or portion of the carrier substrate 2 of the assembly 1 illustrated in FIG. 1, as viewed from different directions.

Figure 3:
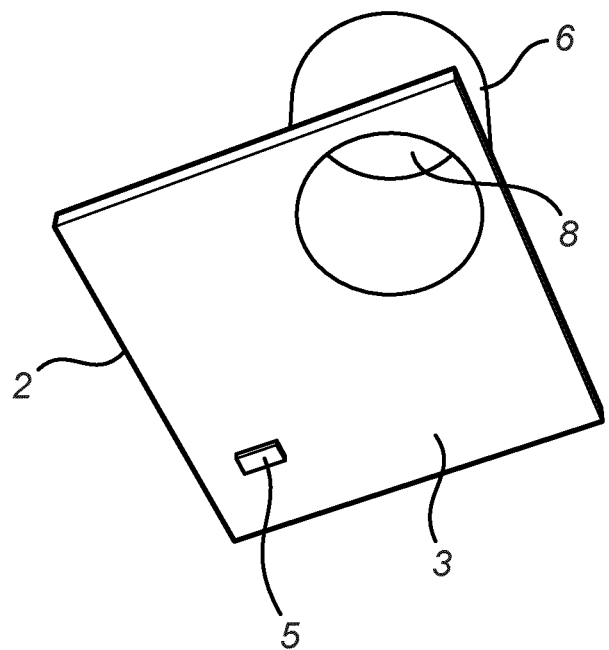
FIGS. 3 and 4 are schematic views of a part or portion of the carrier substrate of the assembly illustrated in FIG. 1, as viewed from different directions.
Figure 4:
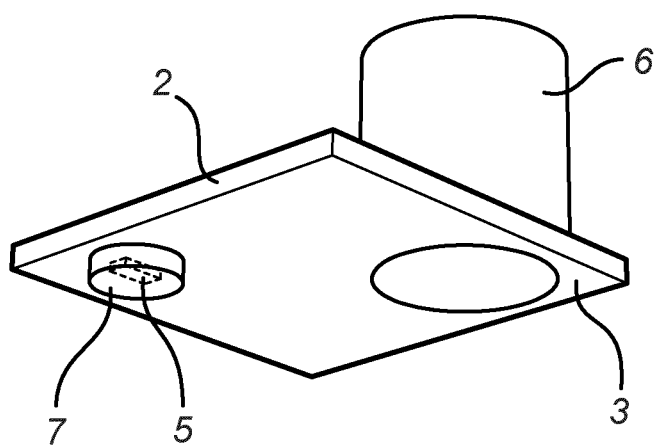

In FIG. 4 it is illustrated that the light-emitting element 5 may be provided with an optical element 7 (not shown in FIGS. 1-3). The optical element 7 is arranged to receive light emitted by light-emitting element 5 and output optically modified light. In accordance with the embodiment of the present invention illustrated in FIG. 4, the optical element 7 comprises by way of example a TIR lens. The optical element 7 may for example be attached to the light-emitting element 5 by gluing the optical element 7 onto the light-emitting element 5 (e.g., using optical glue).

As described in the foregoing for example with reference to FIGS. 1 and 2, each of the tubular structures 6 may be constituted by an integrally arranged portion of the carrier substrate 2. That is to say, each of the tubular structures 6 may be comprised in carrier substrate 2, and may be an integral portion of the carrier substrate 2, and may be made for example by way of deep-drawing, stamping out, or punching through at least a portion of the carrier substrate 2. It is however not necessary for tubular structures 6 to be constituted by integrally arranged portions of the carrier substrate 2. With further reference to FIG. 3, the carrier substrate 2 may be arranged with at least one through-hole, which is indicated by reference numeral 8 in FIG. 3. The through-hole(s) 8 may be present in the 'final' assembly 1 (in its assembled state) and may at least in part constitute the passage for fluid. The through-hole(s) 8 may extend between the first side 3 and the second side 4. Instead of the tubular structures 6 being constituted by integrally arranged portions of the carrier substrate 2, the tubular structures 6 may be separate components or elements of the assembly 1, for example comprising tubes, and may be at least in part arranged (inserted) within respective ones of through-holes 8 with which the carrier substrate 2 may be arranged. At least a portion of the tubular structures 6 may for example be clamped or fitted within the respective ones of the through-holes 8 or connected or coupled to an inner wall (not shown in the figures) of the respective ones of the through-holes 8, for example by way of glue and/or TIM such as thermal grease or the like. It is to be understood that FIG. 3 illustrates the assembly 1 when the tubular structure 6 has been arranged (inserted) within the through-hole 8.

With further reference to FIGS. 1 and 2, each, or some or at least one of the light-emitting elements 5 may be provided with an optical element such as the optical element 7 illustrated in FIG. 4.

With further reference to FIGS. 1-4, the portions of the carrier substrate 2 corresponding to the different sub-assemblies or portions of the assembly 1 can be regarded as identical or substantially identical 'unit cells', which 'unit cells' when interconnected (e.g., at edges thereof) form an extended carrier substrate—that is the carrier substrate 2—with regularly arranged electrical devices 5 and tubular structures 6 on the extended carrier substrate. According to the embodiment of the present invention illustrated in FIGS. 1-4 there are 192 (12×16) electrical devices 5 (e.g., LEDs) evenly distributed on the carrier substrate 2, as perhaps best illustrated in FIG. 2, with 192 'unit cells' which each comprises an electrical device 5 and a tubular structures 6.

With further reference to FIGS. 1 and 2, the carrier substrate 2 may for example comprise a MCPCB having the shape of a plate. The plane of the plate may for example have dimensions of about 500 mm×500 mm, or about 600 mm×600 mm. For example, in order to realize a lighting device or luminaire capable of emitting light having a luminuous flux exceeding 20 klm, 264 or more LEDs, each being capable of emitting light having a luminuous flux of about 80 lm, may be employed. In order to achieve a lighting device or luminaire capable of emitting light having a luminuous flux exceeding 20 klm wherein there are 264 electrical devices 5 (e.g., LEDs) evenly distributed on the carrier substrate 2, the plane of the portion of the plate constituted by each 'unit cell' would have to have dimensions of about 2.7 cm times 2.7 cm. Such as described in the foregoing, each of the tubular structures 6 may be comprised by a tube having inner walls which define a cylindrical passage for (ambient) air, and there may be one tubular structure 6 for each electrical device 5 (e.g., a LED). With 264 LEDs arranged on the carrier substrate 2, and with each of the tubes 6 having a diameter of about 13 mm and a total length of about 15 mm, the total surface area for cooling the assembly 1 may become about 1.62 m$^2$. According to calculations made by the inventors the LEDs 5 may be cooled by up to about 35° C. by way of such a configuration of the assembly 1.

Figure 5:
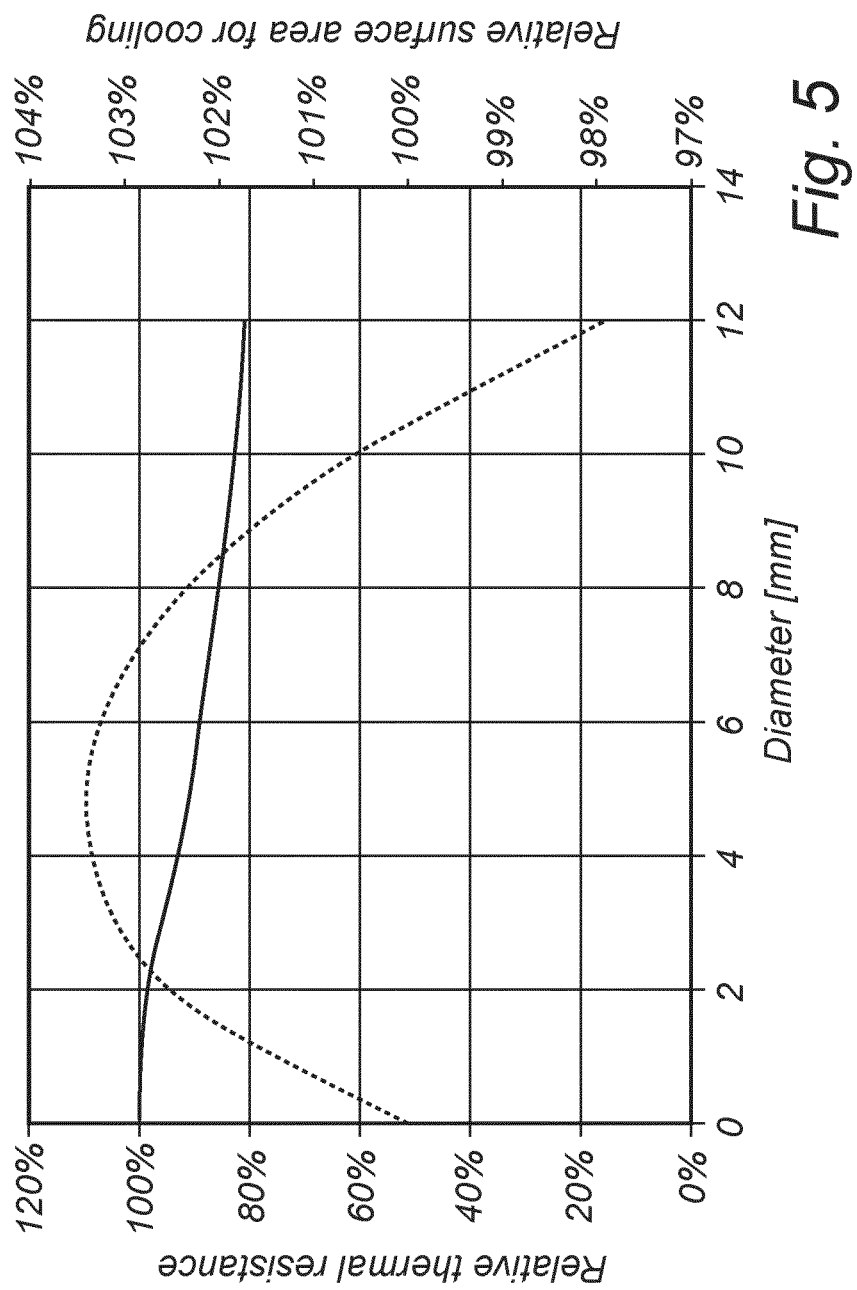
FIG. 5 is a graph illustrating the relative thermal resistance and the relative surface area for cooling with respect to an assembly according to an embodiment of the present invention.

FIG. 5 is a graph illustrating the relative thermal resistance and the relative surface area for cooling with respect to an assembly according to an embodiment of the present invention. The relative thermal resistance is represented by the solid line in FIG. 5, and the relative surface area (of the assembly) for cooling is represented by the dashed line in FIG. 5. As known in the art, thermal resistance is a property of a material or structure characterizing the material or structure's capability or capacity to resist flow of heat therethrough. The graph in FIG. 5, which is intended to illustrate principles of embodiments of the present invention, is based on computational fluid dynamics simulations of a carrier substrate having the shape of a plate having a thickness of 1 mm and being made of Al, and having nine heat-generating devices, for example electrical devices such as light-emitting elements which generate heat when in use, evenly or regularly distributed on one side of the carrier substrate (plate) in a grid pattern having 3×3 grid points. In the simulations it has been assumed that the heat-generating devices provide the same heat load. The carrier substrate is arranged with tubular structures in the form of circular punched-out through-holes in the carrier substrate with the punched-out portions of the carrier substrate protruding a distance 3 mm from one of the sides of the carrier substrate. The graph illustrates the relative thermal resistance and the relative surface area for cooling as a function of the diameter of the circular, punched-out through-holes. In the graph, a diameter of 0 mm corresponds to the case where the carrier substrate has not been arranged with tubular structures (i.e., the carrier substrate is solid). The relative thermal resistance and the relative surface area for cooling are expressed in percentages as compared to the case where the carrier substrate is solid, and has not been arranged with tubular structures. As can be seen in the graph in FIG. 5, the relative thermal resistance is first increasing, from a diameter of the circular, punched-out through-holes of 0 mm up to about 5 mm, and is then decreasing as the diameter of the circular, punched-out through-holes gradually increases. Although the relative surface area for cooling is first slightly decreasing from a diameter of the circular, punched-out through-holes of 0 mm, the decrease in the relative thermal resistance is larger. When the diameter of the circular, punched-out through-holes is about 10 mm, the carrier substrate has (about) the same surface area for cooling as a solid carrier substrate (i.e., a carrier substrate which has not been arranged tubular structures), while the relative thermal resistance is about 17% lower. Thus, by way of employing a carrier substrate arranged with circular, punched-out through-holes having a diameter of about 10 mm, about 17% more heat may be dissipated as compared to a solid carrier substrate, even though the total volume of the material of the solid carrier substrate and the total volume of the material of the carrier substrate arranged with circular, punched-out through-holes having a diameter of about 10 mm are (about) the same.

Figure 6:
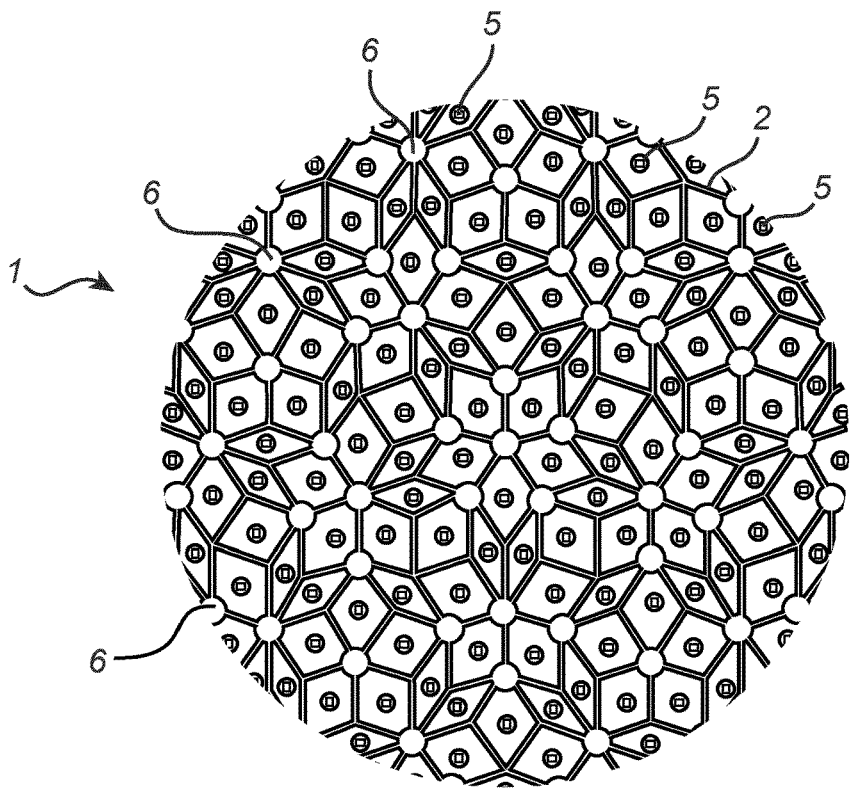
FIGS. 6 and 7 are schematic views of assemblies according to embodiments of the present invention, as viewed from one side of the respective assemblies.
Figure 7:
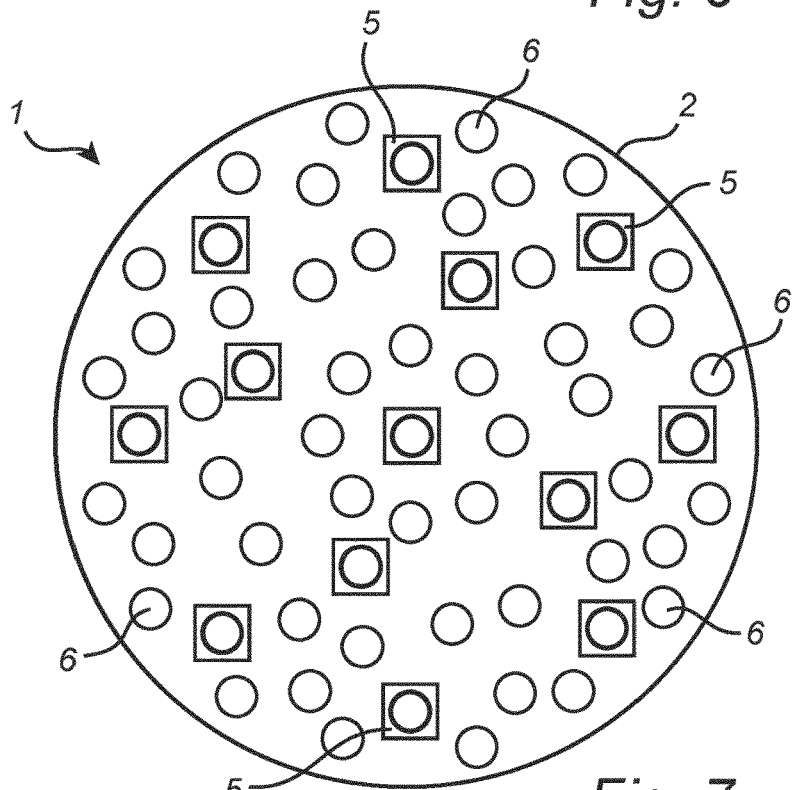

FIGS. 6 and 7 are schematic views of assemblies 1 according to embodiments of the present invention, as viewed from one side of the respective assemblies 1. In accordance with the embodiments of the present invention illustrated in FIGS. 6 and 7, the respective illustrated assemblies 1 comprise a disc-like carrier substrate 2, such that the carrier substrates 2 when viewed from one of its sides is circular, as illustrated in FIGS. 6 and 7. However, it is to be understood that the carrier substrates 2 being disc-like is according to a non-limiting example, and that other shapes of the carrier substrates 2 are possible. Each of the assemblies 1 illustrated in FIGS. 6 and 7 comprises a plurality of electrical devices 5 in the form of light-emitting elements arranged on the side of the respective assembly 1 that is depicted in FIGS. 6 and 7, respectively. Any one or each of the light-emitting elements may for example comprise one or several LEDs. In alternative or in addition, any one or each of the light-emitting elements may comprise a COB LED light source, which is in accordance with the embodiment of the present invention illustrated in FIG. 7. Only some of the electrical devices 5 (light-emitting elements) are indicated by reference numerals in FIGS. 6 and 7. Any one or each of the light-emitting elements may be provided with at least one optical element arranged to receive light emitted by the light-emitting element and output optically modified light. The optical element may for example cover the light-emitting element. The optical element may for example comprise a TIR lens. The carrier substrate 2 of each of the assemblies 1 illustrated in FIGS. 6 and 7 is arranged with an arrangement of a plurality of tubular structures 6. Each tubular structure 6 is at least in part hollow and arranged so as to permit passage of fluid through the carrier substrate 2 between the side of the carrier substrate 2 depicted in FIGS. 6 and 7, respectively, and another side of the carrier substrate 2 (not shown in FIGS. 6 and 7). Each tubular structure 6 is arranged such that it has an extension so that it protrudes a predefined distance from at least one of the above-mentioned sides of the carrier substrate 2 (not shown in FIGS. 6 and 7). Only some of the tubular structures 6 are indicated by reference numerals in FIGS. 6 and 7.

According to the embodiment of the present invention illustrated in FIG. 6, the plurality of tubular structures 6 are irregularly distributed on the carrier substrate 2, and they form a pattern on the carrier substrate 2 similar to a so called Penrose pattern. It is to be understood that such pattern is according to a non-limiting example and that other patterns are possible. Another kind of pattern in which the plurality of tubular structures 6 may be distributed on the carrier substrate 2 is illustrated in FIG. 7. With an irregular distribution of the plurality of tubular structures 6 on the carrier substrate 2 for example such as illustrated in FIG. 6, there may be no or only few (natural) folding or bending lines in the carrier substrate 2, which may facilitate or permit increasing achieving a relatively high rigidity and/or mechanical stability of the carrier substrate 2.

Figure 8:
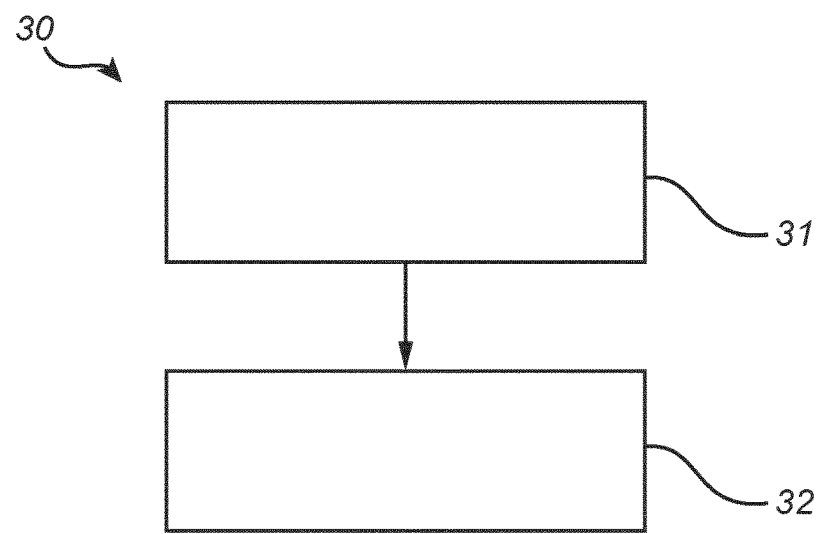
FIG. 8 is a schematic flow diagram of a method for manufacturing an assembly according to an embodiment of the present invention.

FIG. 8 is a schematic flowchart of a method 30 according to an embodiment of the present invention for manufacturing an assembly comprising at least one electrical device and at least one carrier substrate arranged to support the at least one electrical device. The method 30 comprises, at step 31, arranging the at least one carrier substrate with at least one tubular structure which is at least in part hollow and arranged so as to permit passage of fluid through the at least one carrier substrate between a first side of the carrier substrate and a second side of the carrier substrate, wherein the at least one tubular structure is arranged such that it has an extension so that it protrudes a predefined distance from at least one of the first side and the second side. The method 30 may optionally comprise, at step 32, coupling or arranging the at least one electrical device to/on the at least one carrier substrate.

The arranging of the at least one carrier substrate with the at least one tubular structure at step 31 may for example comprise deep-drawing, stamping out, and/or punching through at least a portion of the at least one carrier substrate, whereby the at least one tubular structure is constituted by an integrally arranged portion of the at least one carrier substrate.

The coupling or arranging the at least one electrical device to/on the at least one carrier substrate at step 32 may for example comprise reflow soldering the at least one electrical device to or on the at least one carrier substrate. As mentioned in the foregoing, the at least one electrical device may for example comprise at least one light-emitting element, e.g. comprising a solid state emitter. The at least one carrier substrate may for example comprise a PCB, such as, for example, a MCPCB.

Figure 9:
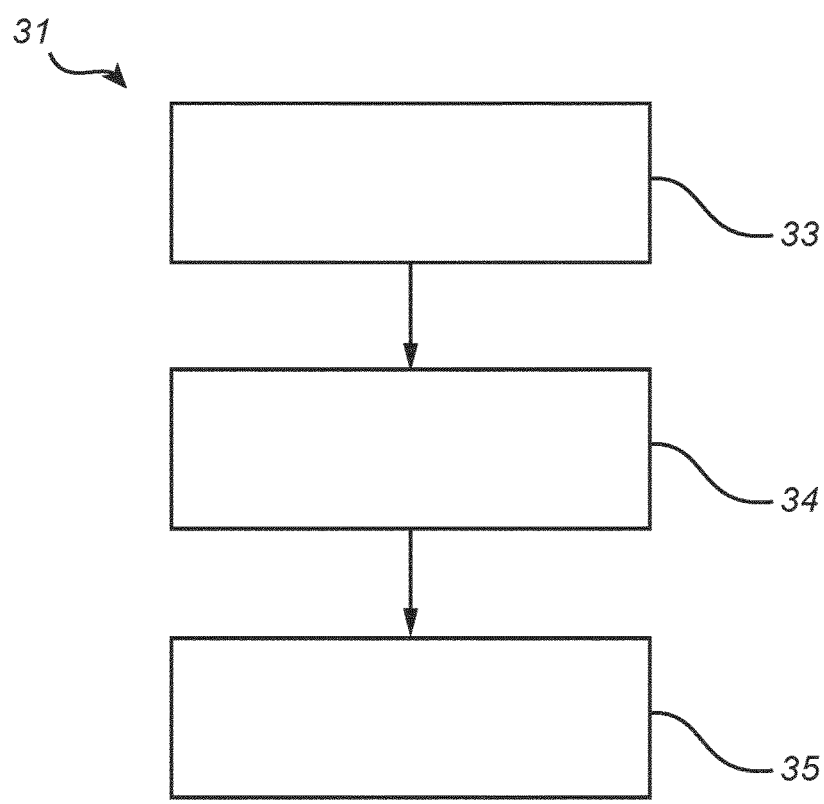
FIG. 9 is a schematic flow diagram of one of the steps in the method illustrated in FIG. 8 in accordance with an embodiment of the present invention.

FIG. 9 is a schematic flowchart of the step 31 illustrated in FIG. 8 in accordance with an embodiment of the present invention. In accordance with an embodiment of the present invention illustrated in FIG. 9, the arranging of the at least one carrier substrate with the at least one tubular structure may comprise providing the at least one carrier substrate with at least one through-hole extending between the first side and the second side, 33. At least one tubular structure may be provided, 34. At least a portion of the at least one tubular structure may be arranged within the at least one through-hole such that the at least one tubular structure protrudes the predefined distance from the at least one of the first side and the second side, 35.

Measurements that have been carried out and which illustrate the increased efficiency in dissipation of heat from a carrier substrate by means of utilizing tubular structures such as described herein will now be described. An A4 size (about 21 cm×28 cm) LED board (MCPCB) was prepared with 16 regularly spaced through-holes in a 4×4 grid pattern. Further, an A4 size (about 21 cm×28 cm) LED board (MCPCB) was prepared with 48 regularly spaced through-holes in a 12×4 grid pattern. The through-holes in the LED boards were made by drilling. Both LED boards were provided with 12 COB LEDs. In both of the LED boards the through-holes extended between a first side of the LED board and a second side of the LED board, the second side of the LED board being opposite to the first side of the LED board. Temperatures were measured at three different measuring positions at one side of the LED board: at a first position close to the center of one side of the LED board, at a second position close to an edge of the side of the LED board, and at a third position close to a corner of the side of the LED board. The temperatures were measured after a stabilization period of about an hour. The temperature at the three different measuring positions was measured with and without cylindrical tubes made of Al being clamped or fitted within the respective through-holes. The diameter of the through-holes was 12 mm both for the LED board with 16 through-holes and for the LED board with 48 through-holes. The inner diameter of the tubes was 11 mm both for the LED board with 16 through-holes and for the LED board with 48 through-holes. The length of the tubes was 3 cm. When the tubes were arranged within the respective through-holes, they protruded from one side of the LED board. For the LED board with 16 through-holes, the temperature decreased by about 3.2% (as averaged over the three measuring positions) when the tubes were arranged within the respective through-holes, as compared to when no tubes were arranged within the respective through-holes. For the LED board with 48 through-holes, the temperature decreased by about 15.4% (as averaged over the three measuring positions) when the tubes were arranged within the respective through-holes, as compared to when no tubes were arranged within the respective through-holes. This illustrates the increased efficiency in dissipation of heat from the LED board by means of utilizing tubular structures such as cylindrical tubes, as have been described herein.

In conclusion it is disclosed an assembly comprising at least one electrical device and at least one carrier substrate arranged to support the at least one electrical device. The at least one carrier substrate is arranged with at least one tubular structure, which is at least in part hollow and arranged so as to permit passage of fluid through the at least one carrier substrate, for example between a first side of the carrier substrate and a second side of the carrier substrate, and wherein the at least one tubular structure is arranged such that it has an extension so that it protrudes a predefined distance from at least one of the first side and the second side.

While the present invention has been illustrated in the appended drawings and the foregoing description, such illustration is to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. In the appended claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An assembly comprising:
   at least one electrical device;
   at least one carrier substrate arranged to support the at least one electrical device, the at least one carrier substrate comprising a metal core printed circuit board;
   wherein the at least one carrier substrate is arranged with at least one tubular structure which is at least in part hollow, the tubular structure extending between a first end and a second end and having an opening at each of the ends to thereby permit passage of fluid through the at least one carrier substrate between a first side of the at least one carrier substrate and a second side of the at least one carrier substrate,
   wherein the at least one tubular structure is arranged such that it has an extension so that it protrudes a predefined distance from at least one of the first side and the second side, and
   wherein the at least one tubular structure is constituted by an integrally arranged portion of the at least one carrier substrate and comprises or is constituted by a deep-drawn, stamped-out or punched-through portion of the at least one carrier substrate.

2. The assembly according to claim 1, wherein the at least one carrier substrate is arranged with an arrangement of a plurality of tubular structures, each tubular structure being at least in part hollow and arranged so as to permit passage of fluid through the at least one carrier substrate between the first side and the second side, and wherein each tubular structure is arranged such that it has an extension so that it protrudes a predefined distance from at least one of the first side and the second side.

3. The assembly according to claim 2, wherein the at least one carrier substrate is arranged such that the plurality of tubular structures are regularly distributed on the first side and/or the second side.

4. The assembly according to claim 2, wherein the at least one carrier substrate is arranged such that the plurality of tubular structures are irregularly distributed on the first side and/or the second side.

5. The assembly according to claim 2, comprising a plurality of electrical devices, wherein the assembly is arranged such that it is constituted by a plurality of substantially identical sub-assemblies, each sub-assembly comprising a part or portion of the at least one carrier substrate and at least one of the plurality of electrical devices and being arranged with at least one of the plurality of tubular structures.

6. The assembly according to claim 1, wherein the at least one electrical device comprises at least one light-emitting element, and wherein the assembly further comprises at least one optical element arranged to receive light emitted by the at least one light-emitting element and output optically modified light.

7. The assembly according to claim 1, wherein the at least one carrier substrate is provided with at least one indentation.

8. A lighting device comprising an assembly according to claim 1, wherein the at least one electrical device comprises at least one light-emitting element.

9. The assembly according to claim 1, wherein the fluid is air.

10. A method for manufacturing an assembly comprising at least one electrical device and at least one carrier substrate arranged to support the at least one electrical device, the at least one carrier substrate comprising a metal core printed circuit board, and the method comprising:

arranging the at least one carrier substrate with at least one tubular structure which is at least in part hollow, the tubular structure extending between a first end and a second end and having an opening at each of the ends to thereby permit passage of fluid through the at least one carrier substrate between a first side of the at least one carrier substrate and a second side of the at least one carrier substrate, wherein the at least one tubular structure is arranged such that it has an extension so that it protrudes a predefined distance from at least one of the first side and the second side, wherein the arranging of the at least one carrier substrate with the at least one tubular structure comprises deep-drawing, stamping out, or punching through at least a portion of the at least one carrier substrate, whereby the at least one tubular structure is constituted by an integrally arranged portion of the at least one carrier substrate.

11. A method of claim 10 wherein the fluid is air.

* * * * *